(12) United States Patent
Kubo (10) Patent No.: US 11,352,811 B2
(45) Date of Patent: Jun. 7, 2022

(54) CAPACITIVE PROXIMITY SENSOR (71) Applicant: Tokyo Parts Industrial Co., Ltd., Gunma-ken (JP)

(72) Inventor: Mamoru Kubo, Gunma-ken (JP)

(73) Assignee: Tokyo Parts Industrial Co., Ltd.

( * ) Notice: Subject to any disclaimer, the term of this patent is extended or adjusted under 35 U.S.C. 154(b) by 245 days.

(21) Appl. No.: 16/842,960

(22) Filed: Apr. 8, 2020

(65) Prior Publication Data
US 2020/0370333 A1 Nov. 26, 2020

(30) Foreign Application Priority Data

May 21, 2019 (JP) .............................. JP2019-095042

(51) Int. Cl.
*E05B 17/22* (2006.01)
*B60R 19/48* (2006.01)
*B60J 5/10* (2006.01)
*H03K 17/955* (2006.01)
*E05B 81/78* (2014.01)
*E05B 65/10* (2006.01)

(52) U.S. Cl.
CPC ................. *E05B 17/22* (2013.01); *B60J 5/10* (2013.01); *B60R 19/483* (2013.01); *E05B 65/10* (2013.01); *E05B 81/78* (2013.01); *H03K 17/955* (2013.01)

(58) Field of Classification Search
CPC ... B60R 19/483; B60R 25/2054; E05B 65/10; E05B 17/22; E05B 81/78; B60J 5/10; E05F 15/73; H03K 17/955; H03K 2217/960735; E05Y 2900/546; E05Y 2400/44; E05Y 2400/858
See application file for complete search history.

(56) References Cited

U.S. PATENT DOCUMENTS

2017/0350169 A1* 12/2017 Kubo ...................... E05B 85/10

FOREIGN PATENT DOCUMENTS

| JP | 2931588 | B1 | * | 8/1999 |
| JP | 2001055852 | A | | 2/2001 |
| JP | 2002039708 | A | | 2/2002 |
| JP | 2002057564 | A | | 2/2002 |
| JP | 2014500414 | A | | 1/2014 |
| JP | 2015021238 | A | * | 2/2015 |
| JP | 2015021238 | A | | 2/2015 |

OTHER PUBLICATIONS

Machine Translation JP 2015021238 (Year: 2015).*
Machine Translation JP 2931588 (Year: 1999).*

* cited by examiner

*Primary Examiner* — Lee E Rodak
*Assistant Examiner* — Brent J Andrews
(74) *Attorney, Agent, or Firm* — Jordan and Koda, PLLC

(57) ABSTRACT

A sensor electrode has an upper side portion arranged on an automobile, a lower side portion arranged with a predetermined spacing from the upper side portion, and a connecting portion that connects the upper side portion and the lower side portion. A control unit inputs a signal for detecting a user to the upper side portion, the lower side portion, and the connecting portion, which are electrically connected. The lower side portion is arranged farther from an area through which the user passes than the upper side portion. The installation height of the upper side portion is greater than or equal to the installation height of the lower side portion.

2 Claims, 11 Drawing Sheets

FIG. 11C

CAPACITIVE PROXIMITY SENSOR

BACKGROUND OF THE INVENTION

The present invention relates to a capacitive proximity sensor that is installed, for example, in the rear bumper of an automobile, and detects a user's foot.

Technology is conventionally known in which a user's foot is detected using an electrostatic sensor installed in the lower part of a vehicle, in order to open and close a vehicle door (back door, sliding door or the like), wherein the vehicle door is opened and closed based on the detection results.

For example, Japanese Patent Laid-Open Publication No. 2015-21238 describes a device for opening and closing a vehicle door having a plurality of lower electrostatic sensors that detect a user's foot and an upper electrostatic sensor that detects a user's body, other than the feet. In this device for opening and closing a vehicle door, when a detection signal from one of the lower electrostatic sensor sensor-units and a detection signal from the upper electrostatic sensor are obtained, a drive signal for driving the vehicle door open or driving the vehicle door closed is output to a door drive device. However, if detection signals are obtained from two or more of the lower electrostatic sensor sensor-units, the drive signal is not output to the door drive device.

With the device for opening and closing a vehicle door in Japanese Patent Laid-Open Publication No. 2015-21238, when a user is detected by at least two of the lower electrostatic sensor sensor-units, opening or closing of the vehicle door is not started, or is stopped, whereby user safety can be maintained.

Furthermore, Japanese Translation of PCT International Application Publication No. JP-T-2014-500414 describes a sensor unit having two proximity sensors for operating a vehicle door in a non-contact manner. When this sensor unit is used for opening and closing a tailgate, sensor units are arranged in the rear bumper of the vehicle, parallel to the transverse direction of the vehicle, and the detection area of one proximity sensor extends beyond the detection area of the other proximity sensor.

With the sensor unit in Japanese Translation of PCT International Application Publication No. JP-T-2014-500414, by evaluating signals generated by at least two proximity sensors, movement in the Y direction and the movement in the X direction or the Z direction can be distinguished, and user requests for opening or closing the vehicle door can be accurately detected.

However, capacitive sensors such as described in these publications require the use of two or more electrostatic sensors, and thus have a problem in terms of increased cost.

SUMMARY OF THE INVENTION

An object of the present invention is to provide a capacitive proximity sensor that allows for cost reduction.

The capacitive proximity sensor according to an exemplary mode of embodiment of the present invention comprises:

a resonance circuit having a sensor electrode; and a microcomputer that inputs a signal for detecting a user to the resonance circuit, characterized in that:

the sensor electrode has an upper side portion, a lower side portion arranged with a predetermined spacing from the upper side portion, and a connecting portion that electrically connects the upper side portion and the lower side portion;

the lower side portion is arranged farther from an area through which the user passes than the upper side portion; and the installation height of the upper side portion is greater than or equal to the installation height of the lower side portion.

With the capacitive proximity sensor of the present invention, a human body (a user's foot) can be detected with one sensor electrode, and thus a capacitive proximity sensor that allows for cost reduction can be obtained.

DETAILED DESCRIPTION OF THE PREFERRED EMBODIMENTS

A capacitive proximity sensor 1 according to an exemplary mode of embodiment of the present invention will be described with reference to the drawings.

Figure 1A:
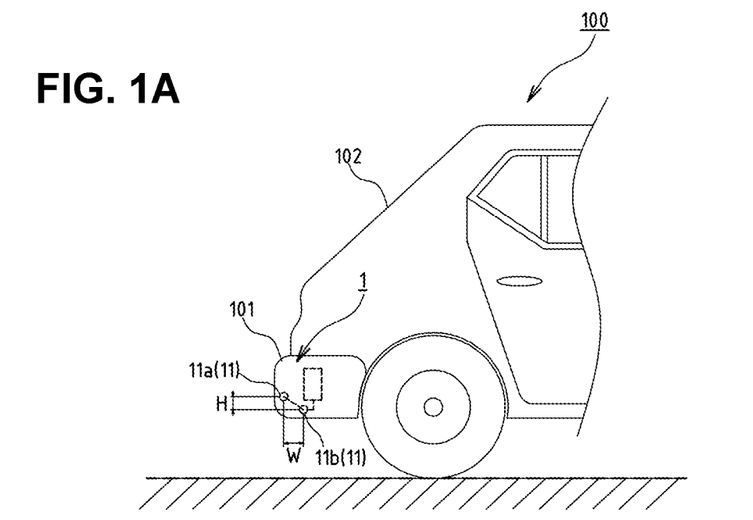
FIG. 1A is a schematic view showing the situation in which a capacitive proximity sensor according to an exemplary mode of embodiment of the present invention is installed on an automobile.

The capacitive proximity sensor 1 according to the exemplary mode of embodiment of the present invention is installed in a rear bumper 101 of an automobile 100 as shown in FIG. 1A, and when the user performs a kick movement in which a foot is inserted below the rear bumper 101, control for opening or closing the back door 102 is automatically implemented.

Note that a kick movement in the present invention refers to an uninterrupted sequence of reciprocation movements, starting with the user 40 inserting a foot 41 below the rear bumper 101 and ending with removal of the same.

Figure 2:
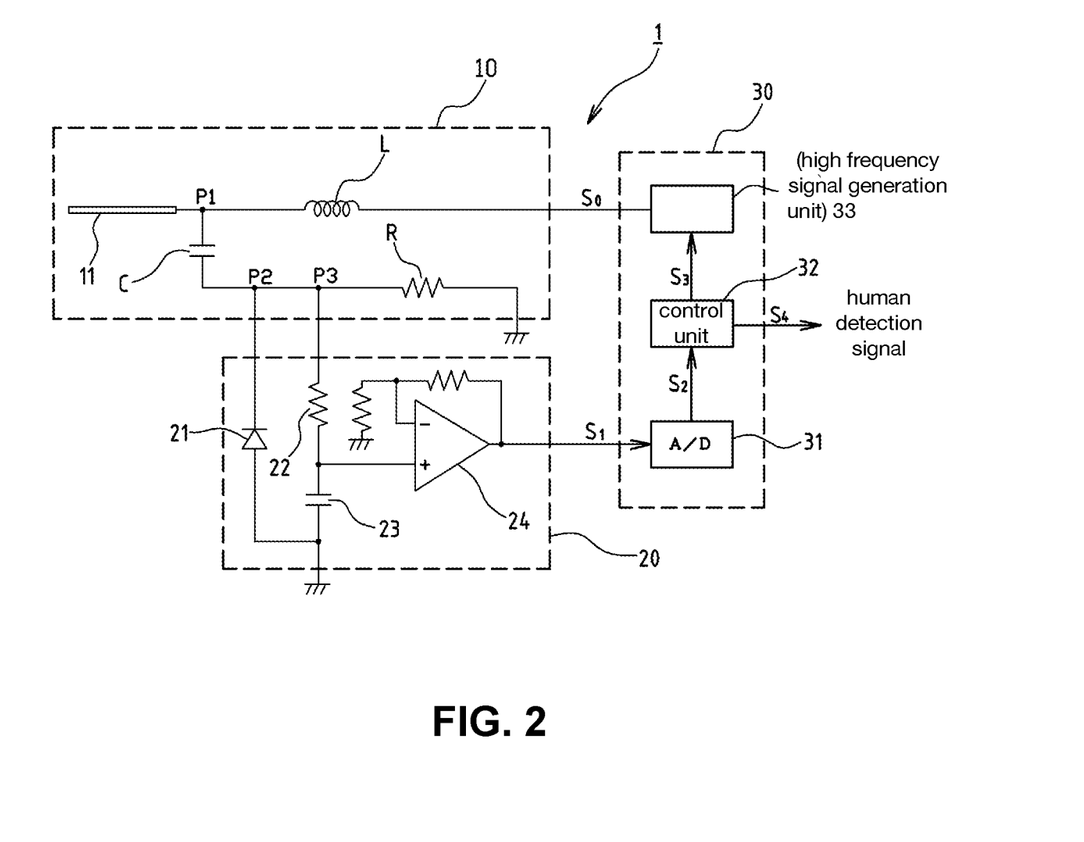
FIG. 2 is a block diagram showing the general configuration of a capacitive proximity sensor according to an exemplary mode of embodiment of the present invention.

As shown in the block diagram in FIG. 2, the proximity sensor 1 of the present example principally comprises an LCR resonance circuit 10, a sensor circuit 20, and a microcomputer 30.

The LCR resonance circuit 10 is provided with: an LCR series resonance circuit in which a coil L, a capacitor C, and a resistor R are connected in series in this order; and a sensor electrode 11.

In order to detect a foot of a user of the automobile 100, a predetermined high-frequency signal $S_0$ is input to the sensor electrode 11 from a high-frequency signal generation unit 33.

The sensor electrode 11 is connected in parallel with the capacitor C to a sensor electrode connection point P1 downstream of the coil L and upstream of the capacitor C. When a user's foot or the like approaches the sensor electrode 11, the self-capacitance of the sensor electrode 11 increases.

The inductance of the coil L in the present example is 4.7 mH, the capacitance of the capacitor C is 7 pF, and the resistance of the resistor R is 470Ω, but these values can be set as appropriate.

The sensor electrode 11 is arranged affixed to a non-magnetic resin plate along the vehicle width direction of the automobile 100 (the direction perpendicular to the paper plane of FIG. 1A) within the rear bumper 101.

A distance of approximately 1 cm is provided between the sensor electrode 11 and the outer peripheral surface of the rear bumper 101.

The total length of the sensor electrode 11 in the vehicle width direction is slightly shorter than the total length of the automobile in the vehicle width direction.

Figure 1B:
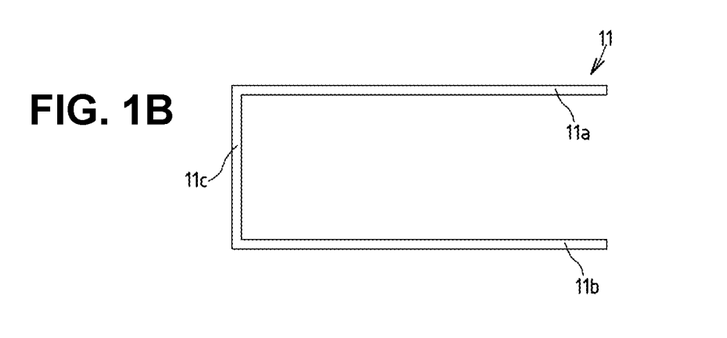
FIG. 1B is an enlarged view of a sensor electrode viewed from the rear of an automobile 100.

The sensor electrode 11 is a single continuous electrode comprising a substantially straight upper side portion 11a arranged along the vehicle width direction of the automobile 100, a substantially straight lower side portion 11b arranged substantially parallel to the upper side portion 11a with a predetermined spacing, and a connecting portion 11c that connects the upper side portion 11a and the lower side portion 11b. In the present example, there is one each of the upper side portion 11a, the lower side portion 11b, and the connecting portion 11c, and these have the same diameter.

There are no particular limitations on the material for the sensor electrode 11, and an insulated wire, a coaxial cable, a conductive metal plate such as a copper plate, or the like can be used.

The lower side portion 11b is arranged farther from an area through which the user passes than the upper side portion 11a. That is to say, the lower side portion 11b is arranged inward with respect to the vehicle body, relative to the upper side portion 11a (to the right in FIG. 1A). Meanwhile, the upper side portion 11a is arranged at a position equal with the lower side portion 11b, or higher than the lower side portion 11b.

Specifically, the lower side portion 11b of the present example is arranged distanced from the rear bumper 101, and the upper side portion 11a, which is arranged above the lower side portion 11b, is arranged near the rear bumper 101, such that predetermined installation angle is provided between the lower side portion 11b and the upper side portion 11a.

Figure 1C:
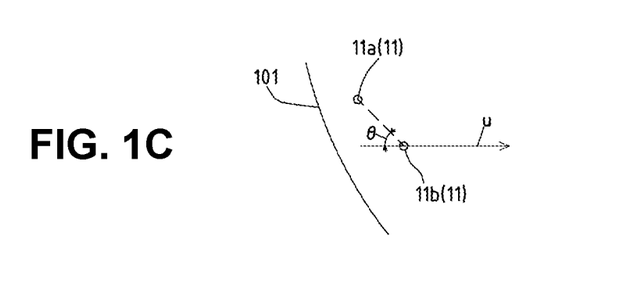
FIG. 1C is a schematic view which shows the installation angle θ of an upper side portion 11a and a lower side portion 11b of the sensor electrode.

This installation angle θ between the lower side portion 11b and the upper side portion 11a refers to an angle rising from the direction of movement of the automobile u, centered on the lower side portion 11b, to the upper side portion 11a, as shown in FIG. 1C.

That is to say, this installation angle θ refers to the angle, with respect to the direction of movement of the automobile, when the upper side portion 11a and the lower side portion 11b are viewed by a user in an overlapping manner.

This installation angle θ is preferably within the range of 20 degrees to 70 degrees, and particularly preferably within the range of 30 degrees to 60 degrees.

Note that the installation angle θ in the present example is 45 degrees.

If this installation angle θ is less than 30 degrees, the sensor electrode 11 will be large in the direction of movement of the automobile, such as to unduly take up installation space. If this installation angle θ exceeds 60 degrees, the sensor electrode 11 will be large in the vehicle height direction of the automobile 100, such as to unduly take up installation space.

Furthermore, if the installation angle θ is less than 20 degrees, the sensor electrode 11 will be large in the direction of movement of the automobile, such as to unduly take up installation space. If this installation angle θ exceeds 70 degrees, the sensor electrode 11 will be large in the vehicle height direction of the automobile 100, such as to unduly take up installation space.

The horizontal direction spacing W between the upper side portion 11a and the lower side portion 11b is preferably 3 cm to 12 cm, particularly preferably 4 cm to 10 cm. If the spacing W is less than 3 cm, the detection area will be excessively narrow. Meanwhile, if the spacing W exceeds 12 cm, the area required for installing the proximity sensor 1 will be excessively large, resulting in cost increases.

Furthermore, the vertical direction spacing H between the upper side portion 11a and the lower side portion 11b is preferably 0 cm to 12 cm, particularly preferably 2 cm to 10 cm. If the upper side portion 11a is at a position higher than the lower side portion 11b by more than 12 cm, it will be difficult to detect the user's leg.

The installation height of the upper side portion 11a is higher than the installation height of the lower side portion 11b. Specifically, when viewed from the rear of the automobile, in the direction of movement u, the upper side portion 11a is arranged above the lower side portion 11b without overlapping with the lower side portion 11b.

The connecting portion 11c is located at the ends of the lower side portion 11b and the upper side portion 11a, such that, when viewed from the rear of the automobile 100, the sensor electrode 11 is substantially C-shaped (see FIG. 1B).

The total length of the upper side portion 11a in the vehicle width direction is the same as the total length of the lower side portion 11b in the vehicle width direction, and the lower side portion 11b is arranged so as to face the upper side portion 11a, along the entirety thereof.

Here, facing refers to the upper side portion 11a and the lower side portion 11b being overlapped when the user stands to the rear of the automobile and looks at the upper side portion 11a and the lower side portion 11b along the installation angle θ, in FIG. 1C.

That is to say, here, facing refers to the situation in which, in FIG. 1C, if the upper side portion 11a were translated slightly in the direction of movement of the automobile (to the right in FIG. 1C) and translated slightly in the vehicle height direction (downward in FIG. 1C), it would be in the position of the lower side portion 11 b.

As a result of providing the upper side portion 11a and the lower side portion 11b in this sensor electrode 11, when the user performs a kick movement of inserting the foot (instep) under the rear bumper 101, the lower side portion 11b will be located near the user's foot (instep), such that the user's foot can be detected. Furthermore, if the user passes near the rear bumper 101, the upper side portion 11a will be located near the user's leg (shin), and therefore the user's leg (shin) will also result in a reaction.

If the upper side portion 11a were not provided, but rather only the lower side portion 11b were provided, while the kick movement of the user could be detected, if the user were to perform a kick movement while standing slightly distanced (approximately 1 cm) from the rear bumper 101, it is possible that the back door 102, for which opening and closing control is performed, would strike the user. Here, by providing both the upper side portion 11a and the lower side portion 11b, if the user stands slightly distanced from the rear bumper 101, the upper side portion 11a can detect that the user is standing slightly distanced from the rear bumper 101, such that control is performed so as to disable object detection.

Furthermore, in a state where objects can be detected, the kick movement of the user can be detected by way of the lower side portion 11b.

However, since the sensor electrode of the present example is a single electrode, it may be difficult to discriminate between an intentional movement by an object (kick movement of the foot in order to open or close the back door 102) and an unintentional movement by an object (for example, when an object simply passes by, in the vehicle width-direction of the automobile 100, in the vicinity of the area below the rear bumper 101). Here, in the present example, detection times (a first reference range and a second reference range for the determination voltage signal $S_1$, described hereafter) are set so that these cases can be determined more reliably.

The sensor circuit 20 has a diode 21 for half-wave rectification, a fixed resistor 22 and a capacitor 23 constituting a low-pass filter, and an amplifier (buffer circuit) 24.

This sensor circuit 20 outputs a determination voltage signal $S_1$ corresponding to the self-capacitance of the sensor electrode 11, based on an electrical signal output from the LCR resonance circuit 10. Specifically, the sensor circuit 20 outputs the determination voltage signal $S_1$ based on the electrical signal at the detection point P3 downstream of the capacitor C and upstream of the resistance R. The diode 21 is connected at a rectification point P2 between the capacitor C and the detection point P3.

Note that the sensor circuit 20 can have any circuit configuration, so long as it outputs a determination voltage signal $S_1$ corresponding to the self-capacitance of the sensor electrode 11. Furthermore, by lowering the resistance value of the resistor R, it is possible to reduce the influence of noise.

By inputting the electrical signal to the sensor circuit 20 at the detection point P3 downstream of the capacitor C and upstream of the resistor R in the LCR resonance circuit 10, as in the present example, the self-capacitance in the sensor electrode 11 can be detected using an inexpensive detection circuit with high input impedance. Specifically, with the proximity sensor 1 of the present example, the current flowing in the LCR resonance circuit 10 is converted to a voltage and input to the sensor circuit 20, wherein the sensor circuit 20 is not directly connected to the sensor electrode 11. For this reason, the sensor circuit 20 has little influence on the self-capacitance of the sensor electrode 11, and can detect the self-capacitance of the sensor electrode 11 even if the input impedance of the sensor circuit 20 changes slightly due to environmental temperature changes or the like.

The microcomputer 30 includes an AD converter 31, a control unit 32, and a high-frequency signal generation unit 33. The A/D converter 31 performs A/D conversion of the determination voltage signal $S_1$ input from the sensor circuit 20, and outputs this to the control unit 32 as a determination signal $S_2$. As will be described in detail hereafter, the control unit 32 outputs a control signal $S_3$ to the high frequency signal generation unit 33, and if it is determined that a user's foot has approached the sensor electrode 11 based on the determination signal $S_2$ (in other words, the determination voltage signal $S_1$), it also outputs a human detection signal $S_4$. As will be described in detail hereafter, the high-frequency signal generation unit 33, which serves as an oscillator means, outputs a high-frequency signal $S_0$, having a predetermined frequency and a predetermined duty ratio, to the LCR resonance circuit 10, on the basis of the control signal $S_3$, which is input from the control unit 32.

In the present example, a rectangular-wave high-frequency signal is used as the high-frequency signal $S_0$. There are no particular limitations on the frequency of the high-frequency signal $S_0$ but, in applications in which the proximity sensor 1 is installed in the rear bumper 101 in order to detect a user's foot, as in the present example, frequencies of 200 kHz to 1000 kHz are preferable, in consideration of the detection area and detection sensitivity. Note that the high-frequency signal $S_0$ is not limited to rectangular waves, but rather sine waves, triangular waves and the like may be used.

The high-frequency signal $S_0$ input to the LCR resonance circuit 10 is distorted by the coil L and the capacitor C (and the self-capacitance of the sensor electrode 11), and becomes a waveform that is nearly a sawtooth wave, in which the rising edge and the falling edge are delayed, which undergoes half-wave rectification by the diode 21. Furthermore, the electrical signal at the detection point P3 is smoothed by the fixed resistor 22 and the capacitor 23 constituting a low-pass filter, whereafter a determination voltage signal $S_1$ that is close to a direct current is output via the buffer circuit 24.

Figure 3:
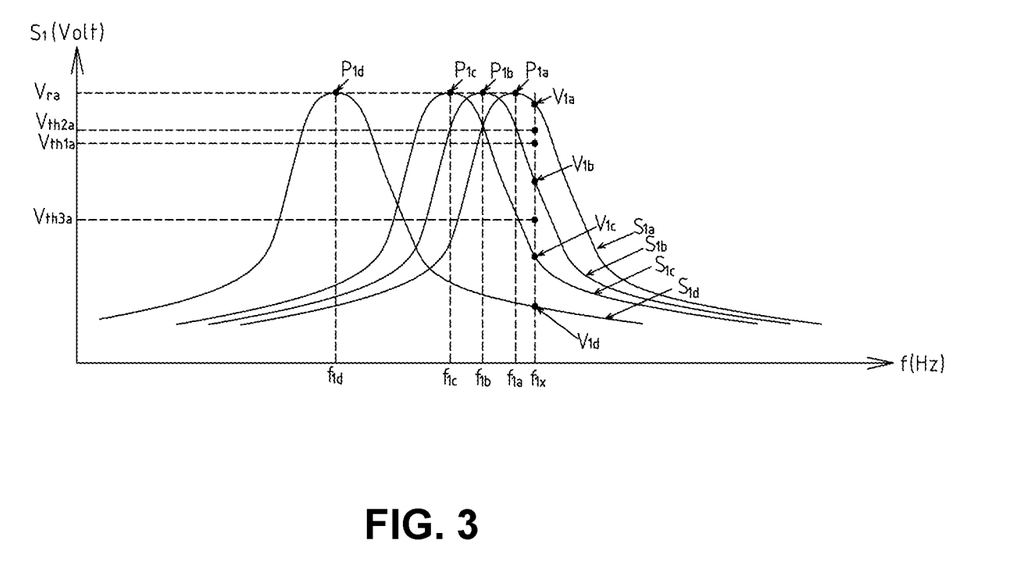
FIG. 3 is a graph showing frequency characteristics of the capacitive proximity sensor according to an exemplary mode of embodiment of the present invention, showing a state $S_{1a}$ in which a detection object is not in proximity, a state $S_{1b}$ in which a user's foot is in proximity of the sensor electrode, a state $S_{1c}$ in which the user's foot is in closer proximity of the sensor electrode, and a state $S_{1d}$ in which the user is in contact with the rear bumper.

FIG. 3 shows the relationship between the frequency f (horizontal axis) of the high-frequency signal $S_0$ input to the LCR resonance circuit 10 and the determination voltage signal $S_1$ (vertical axis) under a certain constant ambient environment.

In FIG. 3, $S_{1a}$ is the graph when no object is in proximity of the sensor electrode 11, $S_{1b}$ is the graph when the user's foot is in proximity (approximately 10 cm) of the sensor electrode 11, $S_{1c}$ is the graph when the user's foot is in closer proximity (approximately 5 cm) of the sensor electrode 11, and $S_{1d}$ is the graph when the user is in contact with the rear bumper 101.

Note that $S_{1c}$ is also the graph when water is in contact with the rear bumper, and $S_{1d}$ is also the graph when water is in contact with the sensor electrode 11.

In FIG. 3, $f_{1a}$ is the resonance frequency when no object is in proximity of the sensor electrode 11, $f_{1b}$ is the resonance frequency when the user's foot is in proximity of the electrode 11, $f_{1c}$ is the resonance frequency when the user's foot is in closer proximity of the sensor electrode 11, and $f_{1d}$ is the resonance frequency when the user is in contact with the rear bumper 101.

As shown in FIG. 3, the resonance frequency $f_{1b}$ when an object is in proximity of the sensor electrode 11 is lower than the resonance frequency $f_{1a}$ when the user's foot is not in proximity of the sensor electrode 11. This is because the self-capacitance of the sensor electrode 11 increases when the user's foot approaches the sensor electrode 11.

Furthermore, the resonance frequency $f_{1c}$ when the user's foot is in closer proximity of the sensor electrode 11 is lower than the resonance frequency $f_{1b}$ when the user's foot is in proximity of the sensor electrode 11. This is because the self-capacitance of the sensor electrode 11 increases when the user's foot further approaches the sensor electrode 11.

Furthermore, the resonance frequency $f_{1d}$ when the user is in contact with the rear bumper 101 is lower than the resonance frequency $f_{1c}$ when the user's foot is in closer proximity of the sensor electrode 11. This is because the self-capacitance of the sensor electrode 11 increases when the user contacts the rear bumper 101.

Collectively, these resonance frequencies are in the relationship:

$$f_{1a} > f_{1b} > f_{1c} > f_{1d}.$$

In the proximity sensor 1 of the present example, under a certain constant ambient environment, $f_{1a}$ is approximately 450 kHz, $f_{1b}$ is approximately 445 kHz, $f_{1c}$ is approximately 440 kHz, and $f_{1d}$ is approximately 415 kHz but, even if the ambient environment changes, the difference between $f_{1a}$ and $f_{1b}$ is approximately 5 kHz, the difference between $f_{1b}$ and $f_{1c}$ is approximately 5 kHz, and the difference between $f_{1c}$ and $f_{1d}$ is approximately 25 kHz, which is substantially constant.

Furthermore, the maximum voltage (peak voltage) when no object is in proximity of the sensor electrode 11 (the voltage at point $P_{1a}$ in FIG. 3) and the maximum voltage when the user's foot is in proximity of sensor electrode 11 (the voltage at point $F_{1b}$ in FIG. 3), the maximum voltage when the user's foot is in closer proximity of the sensor electrode 11 (the voltage at point $P_{1c}$ in FIG. 3), and the maximum voltage when the user contacts the rear bumper 101 (the voltage at point $P_{1d}$ in FIG. 3) are substantially the same, at $V_{1a}$, even if the ambient environment changes. $V_{1a}$ in the present example is 2.5 V.

Furthermore, in FIG. 3, $f_{1x}$ is a determination frequency for determining whether or not an object is in proximity of the sensor electrode 11. The determination frequency $f_{1x}$ is set higher than the resonance frequency $f_{1a}$ when no object is in proximity of the sensor electrode 11.

That is to say, the determination frequency $f_{1x}$ and the resonance frequency $f_{1a}$ when no object is in proximity of the sensor electrode 11 are in the relationship:

$$f_{1x} > f_{1a}.$$

Furthermore, in FIG. 3, $V_{1a}$ is a determination voltage signal at the determination frequency $f_{1x}$ when no object is in proximity of the sensor electrode; $V_{1b}$ is a determination voltage signal at the determination frequency $f_{1x}$ when a human body is in proximity of sensor electrode; $V_{1c}$ is a determination voltage signal at the determination frequency $f_{1x}$ when a human body is in closer proximity of the sensor electrode; and $V_{1d}$ is a determination voltage signal at the determination frequency $f_{1x}$ when a human body is in contact with the rear bumper.

Note that, in the present example, $V_{1a}$ is 2 V, $V_{1b}$ is 1.5 V, $V_{1c}$ is 1 V, and $V_{1d}$ is 0.5 V.

Collectively, these determination voltage signals are in the relationship:

$$V_{1a} > V_{1b} > V_{1c} > V_{1d}.$$

Note that the determination frequency $f_{1x}$ is set higher than the resonance frequency $f_{1a}$ when no object is in proximity of the sensor electrode 11. This is to make detection easier by employing the fact that the determination voltage signal also decreases in order (which is to say, $V_{1b} > V_{1c} > V_{1d}$), in the order of decreasing resonance frequency (which is to say, $f_{1b} > f_{1c} > f_{1d}$).

Next, one example of a method for detecting a user's foot in the present example will be briefly described.

First, the control unit 32 controls the frequency of the high-frequency signal $S_0$, which is to say, the determination frequency $f_{1x}$, so as to satisfy the relationship $V_{1a} > V_{1b} > V_{1c}$. Specifically, in the present example, a frequency 5 kHz higher than the resonance frequency $f_{1a}$ when no object is in proximity of the sensor electrode 11 is set as the determination frequency $f_{1x}$.

Also:
a first threshold value $V_{th1a}$ satisfying $V_{1a} > V_{th1a} > V_{1b}$;
a second threshold value $V_{th2a}$ satisfying $V_{1a} > V_{th2a} > V_{1b}$; and
a third threshold value $V_{th3a}$ satisfying $V_{1b} > V_{th3a} > V_{1c}$;
are set.

Furthermore, in the present example, $V_{th2a} \geq V_{th1a}$ is set.
Note that, in the present example, $V_{th1a}$ is set to $V_{1a}-0.2$ V, $V_{th2a}$ is set to $V_{1a}-0.1$ V, and $V_{th1a}$ is set to $V_{1a}-0.7$ V.

When performing detection, a high-frequency signal $S_0$ at a determination frequency $f_{1x}$, determined based on the resonance frequency $f_{1a}$, is applied to the LCR resonance circuit 10. However, since $f_{1a}$ changes depending on changes in the climate and ambient environment, $f_{1a}$ is constantly updated to the most recent value by performing step control that controls the execution of a calibration step and a detection step described hereafter, and the determination frequency $f_{1x}$ is reset based on the most recent $f_{1a}$.

Figure 4:
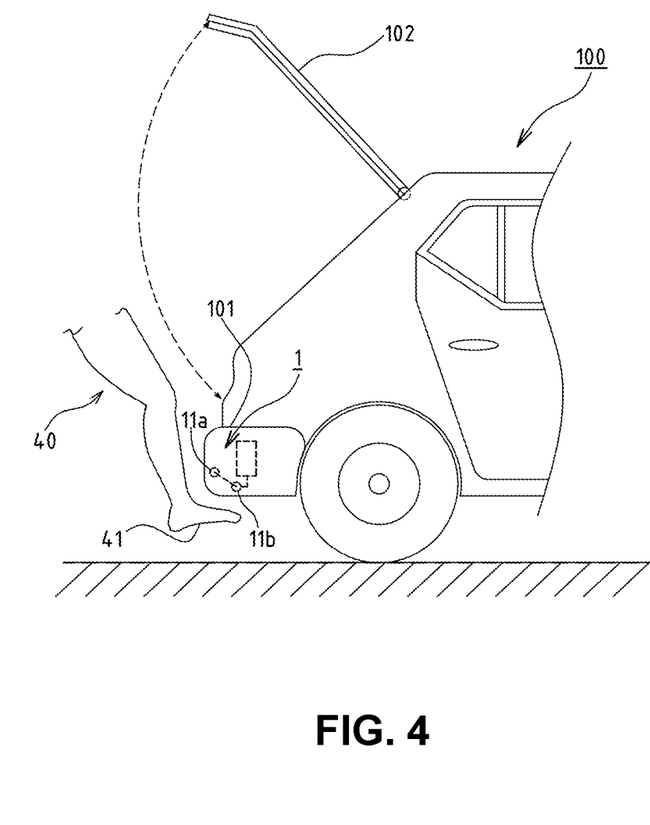
FIG. 4 is a schematic diagram showing the situation in which a foot is detected by the capacitive proximity sensor according to an exemplary mode of embodiment of the present invention.

In the proximity sensor 1 of the present example, when a user 40 inserts a foot 41 below the rear bumper 101, as shown in FIG. 4, under a certain constant ambient environment, the determination voltage signal changes from V1a to V1b and reaches or goes below the first threshold value Vth1a (see FIG. 3 and FIG. 5A). Furthermore, when the user 40 removes the foot 41 from below the rear bumper 101, the determination voltage signal changes from V1b to V1a under a certain constant ambient environment, and reaches or exceeds the second threshold value Vth2a. (See FIG. 3 and FIG. 5A). When this state is detected, the control unit 32 outputs a human detection signal S4, and control is performed for opening or closing the back door 102.

Figure 5A:
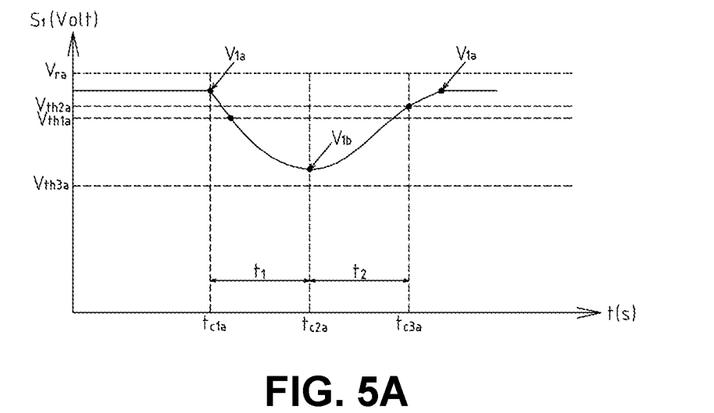
FIGS. 5A, 5B, and 5C are graphs showing the time course of a determination voltage signal S1 from the capacitive proximity sensor according to an exemplary mode of embodiment of the present invention.

FIG. 5A shows the change over time in the determination voltage signal when an intended movement by an object (foot kicking movement in order to open or close the back door 102) is performed, and indicates that the determination voltage signal changes from V1a to V1b and then changes from V1b to V1a. If, as a result of the user 40 performing a kick movement, the determination voltage signal goes from V1a, when no object is in proximity of the sensor electrode, to a minimum voltage V1b (peak voltage) at or below Vth1a and at or above Vth3a, and then reaches Vth2a or higher, the control unit 32 detects that a human body is in proximity of the sensor electrode 11.

Next, the operation of the proximity sensor 1 of the present example will be described with reference to the flowcharts of FIG. 6 to FIG. 9.

Step S0

First, if a user carrying an electronic key is in proximity of the automobile 100, wireless communication is performed between the authentication system installed in the vehicle and the electronic key, and this is authenticated as being an authorized electronic key for the automobile. Note that this authentication can be performed by known authentication methods for smart entry systems.

Once this has been authenticated as being an authorized electronic key, the proximity sensor 1 is driven.

Step S1

The control unit 32 initializes the sensor system, clears the internal registers and memory, sets the normal flag to OFF, sets the calibration flag to ON, and sets the detection step to 0.

Note that when the normal flag is ON, step control is performed in which the calibration step and the detection step are alternately performed as normal control, and when the normal flag is OFF, the calibration step alone is continuously performed as special control.

Steps S2 to S3

Figure 6:
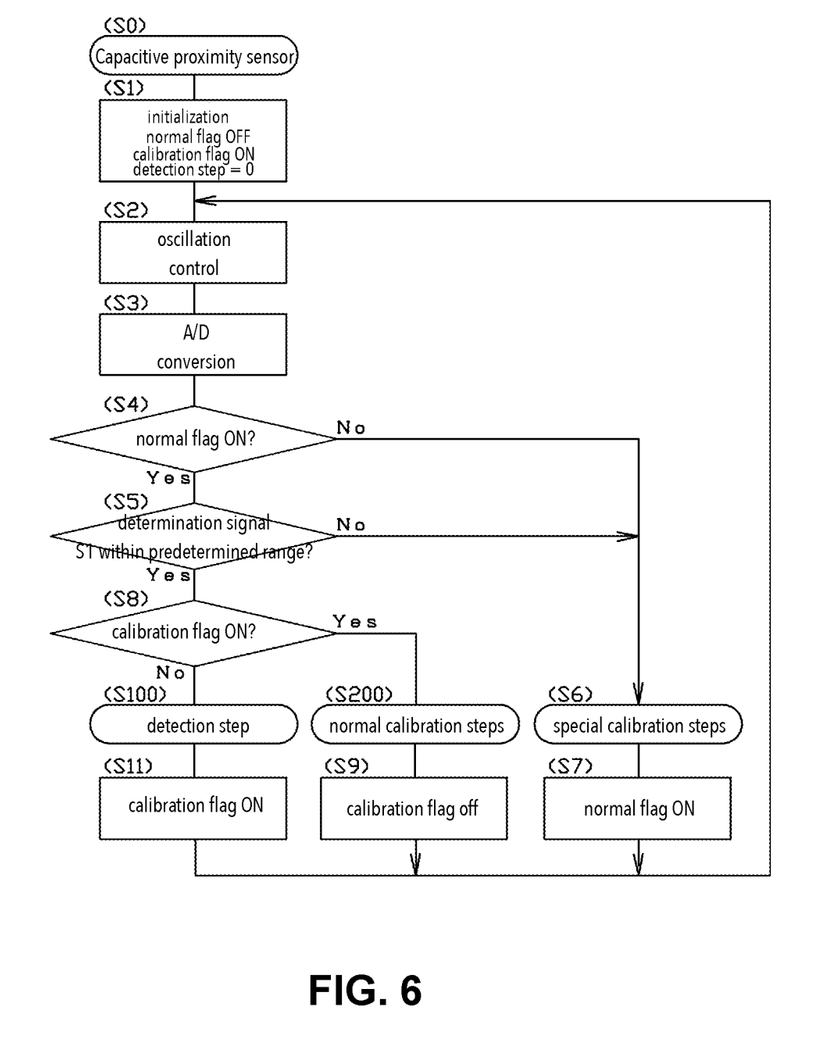
FIG. 6 is a main flowchart serving to describe step control executed in the capacitive proximity sensor according to an exemplary mode of embodiment of the present invention.

The control unit 32 oscillates at the frequency of the high-frequency signal $S_0$ output from the high-frequency signal generation unit 33 with a predetermined duty ratio. Furthermore, when the AD converter 31 performs A/D conversion on the most recent determination voltage signal $S_1$ input from the sensor circuit 20, the most recent determination signal $S_2$ is output from the AD converter 31 to the control unit 32.

Step S4

If the normal flag is ON, the process proceeds to step S5 and, if the normal flag is OFF, the process proceeds to step S6. Note that, when the proximity sensor 1 is initially driven, since the normal flag is OFF in step S1, the process always proceeds to step S6.

Step S5

If the most recent determination voltage signal $S_1$ is not within a predetermined range, it is determined that the situation is not normal, and the process proceeds to step S6. Meanwhile, if the most recent determination voltage signal $S_1$ is within the predetermined range, the process proceeds to step S8. In the present example, a determination is made as to whether the most recent determination voltage signal $S_1$ exceeds the third threshold value $V_{th3a}$, serving as the predetermined range.

Step S6

When the situation is not normal, special calibration is performed.

First, the control unit 32 performs control so as to perform a frequency sweep of the high-frequency signal $S_0$ input from the high-frequency signal generation unit 33 to the LCR resonance circuit 10. In the present example, this frequency sweep is performed at a specified sweep rate from a start frequency of 200 kHz to a stop frequency of 600 kHz.

By performing the frequency sweep, the curve $S_{1a}$ shown in FIG. 3 is obtained, and the resonance frequency $f_{1a}$ of the LCR resonance circuit 10 when no object is in proximity of the sensor electrode 11 and the voltage signal $V_{1a}$ (voltage at point $P_{1a}$) when the high-frequency signal at the resonance frequency $f_{1a}$ is input to the LCR resonance circuit 10 are detected. Note that, in the proximity sensor 1 of the present example, under a certain constant environment, the resonance frequency $f_{1a}$ is 450 kHz and the determination voltage signal $V_{1a}$ is 2.5 V.

In the present example, the determination frequency $f_{1x}$ is set to be 5 kHz higher than the resonance frequency $f_{1a}$.

Furthermore, the first threshold value $V_{th1a}$, the second threshold value $V_{th2a}$, and the third threshold value $V_{th3a}$ are set based on the determination voltage signal $V_{1a}$ in FIG. 3.

Step S7

After performing the special calibration, the normal flag is set to ON and the process returns to step S2.

Step S8

The process checks the calibration flag, and if this calibration flag is ON, the process proceeds to step S200, while if the calibration flag is OFF, the process proceeds to step S100. Note that, when the proximity sensor 1 is initially driven, since the calibration flag is ON in step S1, the process always proceeds to step S200.

Step S200

This normal calibration step is performed so that the proximity of the human body can be detected correctly even if the curve $S_{1a}$ (see FIG. 3) when the object is not in proximity to the sensor electrode 11 changes depending on the ambient environment or the like.

Step S201

If the resonance frequency has been updated, the process proceeds to step S202, and if the resonance frequency has not been updated, the process proceeds to step S210.

Step S202

When the current resonance frequency of the LCR resonance circuit is $f_{1p}$ and the resonance frequency of the LCR resonance circuit immediately before the current time is $f_{1q}$, if $|f_{1q}-f_{1p}|$ exceeds a predetermined value $f_1$, the process proceeds to step S203. Here, it is detected, for example, that the user is standing slightly distanced from the rear bumper 101.

If $|f_{1q}-f_{1p}|$ is less than the predetermined value $f_1$, the process proceeds to step S204.

Note that, in the present example, $f_r$ is set to 4 kHz.

Step S203

If it is detected that the user is standing slightly distanced from the rear bumper 101, the control unit 32 disables detection so that detection of the human body will temporarily not be performed. Then, the control unit 32 sets a detection disabled timer and proceeds to step S210. The detection disabled timer in the present example is set to 3 seconds.

Step S204

If the detection disabled timer has timed out, the process proceeds to step S205, and if the detection disabled timer has not timed out, the process proceeds to step S210.

Step S205

The control unit 32 clears the detection disabling and proceeds to step S210.

Step S9

Figure 7:
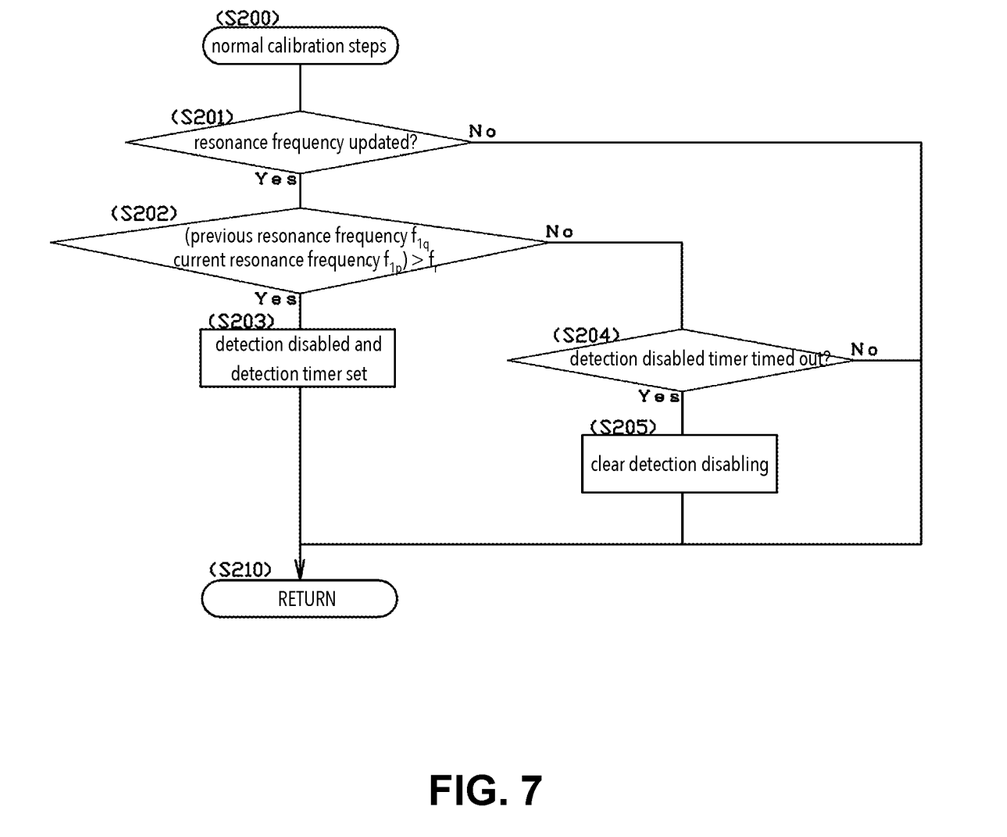
FIG. 7 is a flowchart serving to describe a calibration step in normal operation of the capacitive proximity sensor according to an exemplary mode of embodiment of the present invention.

After the normal calibration step is executed according to the flowchart of FIG. 7, the calibration flag is set to OFF.

Step S100

Next, if the calibration flag is OFF in step 8, a detection step is executed, and user's foot detection determination is performed.

Figure 8:
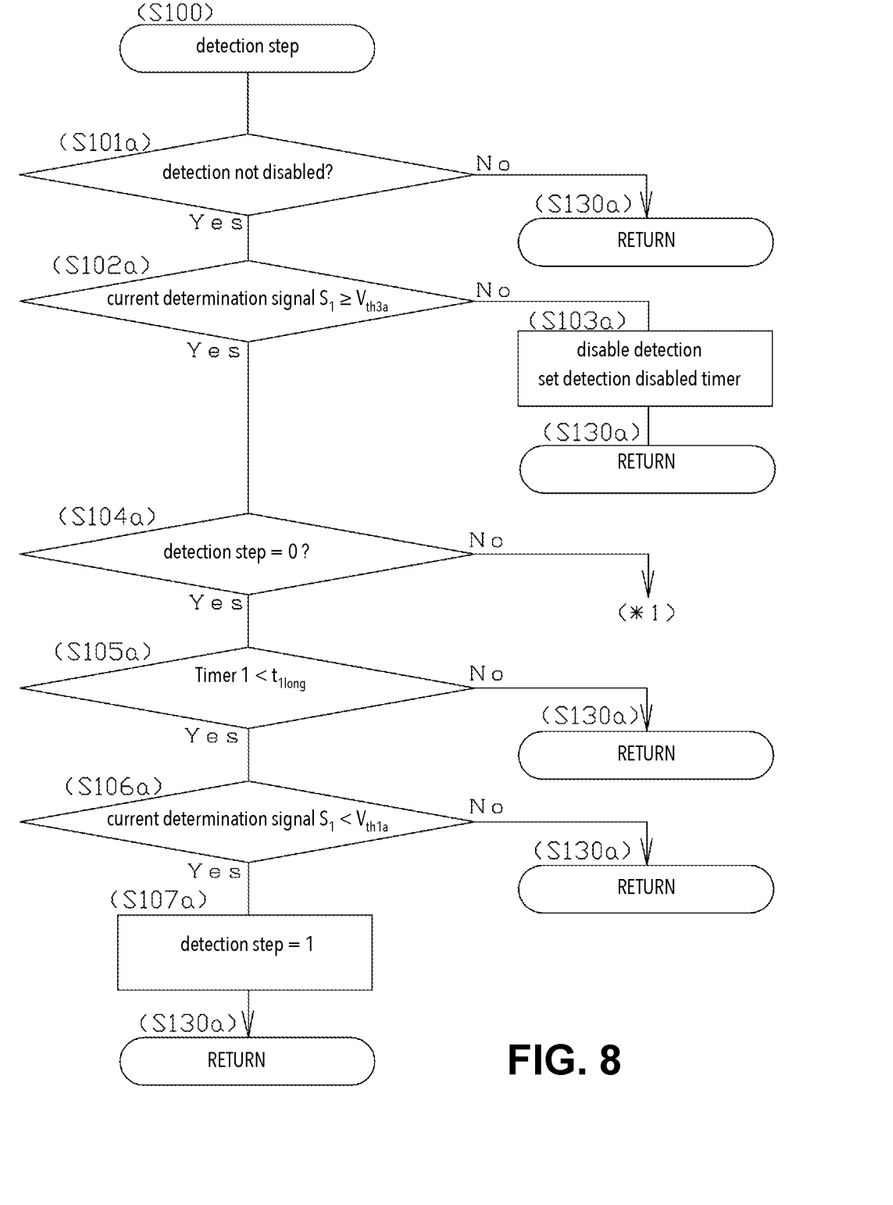
FIG. 8 is a flowchart serving to describe a detection step of performing user's foot detection determination with the capacitive proximity sensor according to an exemplary mode of embodiment of the present invention.
Figure 9:
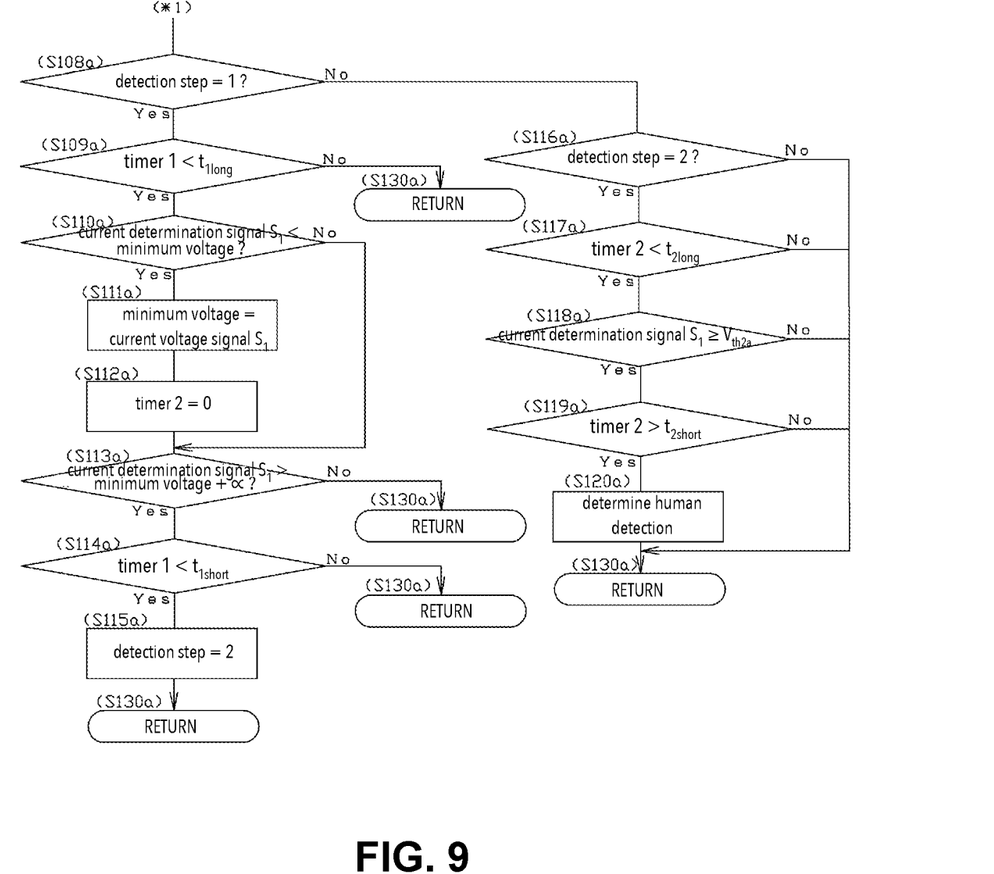
FIG. 9 is a flowchart serving to describe a detection step of performing user's foot detection determination with the capacitive proximity sensor according to an exemplary mode of embodiment of the present invention.

The detection step is executed in accordance with the flowcharts of FIG. 8 and FIG. 9. This detection step is performed in order to discriminate between an intentional movement by an object (kick movement of the foot in order to open or close the back door 102) and an unintentional movement by an object (for example, when an object simply passes by, in the vehicle width-direction of the automobile 100, in the vicinity of the area below the rear bumper 101), by observing the change over time in the determination voltage signal level when the object is in proximity of the sensor electrode 11.

Step S101a

If detection is not disabled, the process proceeds to step S102a, and if detection is disabled, the process proceeds to step S130a.

Step S102a

If the current determination voltage signal $S_1$ the third threshold value $V_{th3a}$, the process proceeds to step S104a, and when the current determination voltage signal $S_1$<the third threshold value $V_{th3a}$, the process proceeds to step S103a.

Step S103a

Figure 5B:
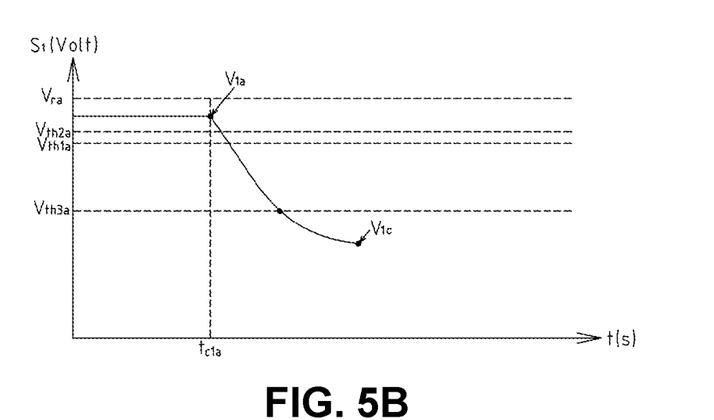
Figure 5C:
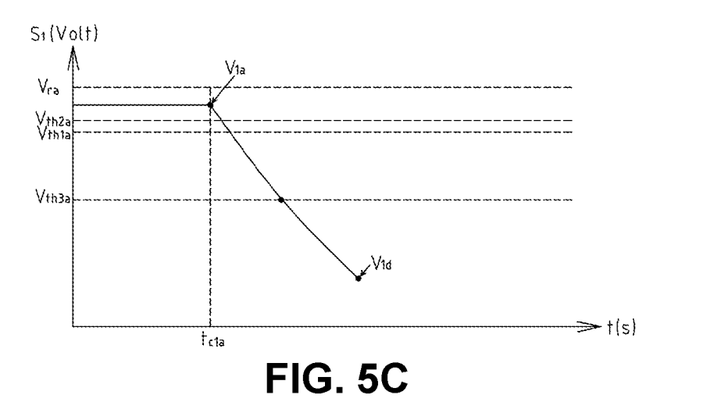

If the determination voltage signal S1<Vth3a, the user's foot is in closer proximity of the sensor electrode 11 (or water is in proximity of the sensor electrode 11) (see FIG. 5B), or the user is in contact with the rear bumper (or water is in contact with the sensor electrode 11) (see FIG. 5C), and thus the detection disabled timer is set so that detection is temporarily not performed.

This is such that, when detection is disabled, a predetermined time is set and the process is repeated until the detection becomes possible. Then, the process proceeds to step S130a.

Step S104a

If the detection step is 0, the process proceeds to step S105a. If the detection step is other than 0, the process proceeds to step S108a.

Note that step S104a through step S107a detect that a time, from when the current determination voltage signal $S_1$ starts dropping from a certain level to when this reaches or goes below $V_{th1a}$, is less than an upper limit value $t_{1long}$ of a first reference range, which has been set in advance.

Step S105a

If timer 1<$t_{1long}$, the process proceeds to step S106a.
If the timer 1>$t_{1long}$, the process proceeds to step S130a.
Note that, in the present example, $t_{1long}$=0.6 s.
Further, the timer 1 is incremented at fixed intervals.

Step S106a

If the current determination voltage signal $S_1$<the first threshold value $V_{th1a}$, the process proceeds to step S107a, and if the current determination voltage signal $S_1 \geq$ the first threshold value $V_{th1a}$, the process proceeds to step S130a.

Step S107a 1 is input for the detection step, and the process proceeds to step S130a.

Step S108a

If the detection step is 1, the process proceeds to step S109a. If the detection step is other than 1, the process proceeds to step S116a.

Note that step S108a to step S115a detect that a time ($t_1$), from when the current determination voltage signal $S_1$ starts dropping from a certain level to when this reaches the minimum voltage $V_{1b}$ below $V_{th1a}$, is between the upper limit value $t_{1long}$ and a lower limit value $t_{1short}$ of the first reference range, which is been set in advance.

Step S109a

If the timer 1<$t_{1long}$, the process proceeds to step S110a.
If the timer 1$\geq t_{1long}$, the process proceeds to step S130a.
In the present example, $t_{1long}$=0.6 s.

Step S110a

If the current determination voltage signal $S_1$<the minimum voltage, the process proceeds to step S111a. If the current determination voltage signal $S_1 \geq$ the minimum voltage, the process proceeds to step S113a.

Here, confirmation is made as to whether or not the level of the current determination voltage signal $S_1$ is continuing to decrease.

Step S111a

The current determination voltage signal $S_1$ is input as the minimum voltage.

Step S112a 0 is input for the timer 2.

Step S113a

If the current determination voltage signal $S_1$>the minimum voltage+$\alpha$, the process proceeds to step S114a. If the current determination voltage signal $S_1 \geq$ the minimum voltage+$\alpha$, the process proceeds to step S130a.

Here, a determination is made as to whether the current determination voltage signal has reached the minimum voltage or not. That is to say, if the level of the determination voltage signal that continued to decrease increases, it is determined that the determination voltage signal has reached the minimum voltage. Note that $\alpha$ is a predetermined value.

Step S114a

If the timer 1>$t_{1short}$, the process proceeds to step S115a.
If the timer 1$\leq t_{1short}$, the process proceeds to step S130a.
In the present example, $t_{1short}$=0.4 s.

Step S115a 2 is input for the detection step, and the process proceeds to step S130a.

Step S116a

If the detection step is 2, the process proceeds to step S117a. If the detection step is other than 2, the process proceeds to step S130a.

Note that, step S116a to step S119a detect that a time ($t_2$), in which the current determination voltage signal $S_1$ reaches or exceeds $V_{th2a}$ from the minimum voltage $V_{1b}$ at or below $V_{th1a}$, is between an upper limit value $t_{2long}$ and a lower limit value $t_{2short}$ of a second reference range, which has been set in advance.

Step S117a

If the timer 2<$t_{2long}$, the process proceeds to step S118a.
If the timer 2$\geq t_{2long}$, the process proceeds to step S130a.
In the present example, $t_{2long}$=0.6 s.

Step S118a

If the current determination voltage signal $S_1 \geq$ the second threshold value $V_{th2a}$, the process proceeds to step S119a, and if the current determination voltage signal $S_1$<the second threshold value $V_{th2a}$, the process proceeds to step S130a.

Step S119a

If the timer 2>$t_{2short}$, the process proceeds to step S120a.
If the timer 2$\leq t_{2short}$, the process proceeds to step S130a.
In the present example, $t_{2short}$=0.4 s.

Step S120a

The control unit 32 determines a kick movement of the user's foot, and the process proceeds to step S11.

Step S11

After performing the user's foot detection determination, the calibration flag is set to ON. If, as described above, the time, from when the determination voltage signal $S_1$ starts dropping from a certain level to reaching the minimum voltage, is within the first reference range which is set in advance, and the time, from the determination voltage signal reaching the minimum voltage to reaching or exceeding $V_{th2a}$, is within the second reference range, which has been set in advance, the control unit 32 detects that a human body is in proximity of the sensor electrode 11.

As described above, in the capacitive proximity sensor 1 of the present example, the calibration flag is set to OFF after the normal calibration steps is performed in step S200. Furthermore, after performing the detection steps in step S100, the calibration flag is set to ON. Then, the control unit 32 performs step control which controls execution of the normal calibration steps in step S200, and the detection steps in step S100. In this step control, if there is no sudden major environmental change (if the determination in step S5 is Yes), in step S8, the processing is alternately assigned to step S100 and step S200, and control is performed such that the normal calibration step and detection step are repeatedly and alternatingly executed as a normal routine.

The capacitive proximity sensor 1 used in an automobile according to an exemplary mode of embodiment of the present invention comprises a resonance circuit 10 having a sensor electrode 11, and a microcomputer 30 that inputs a signal $S_0$ for detecting a user to the resonance circuit 10.

The sensor electrode 11 has an upper side portion 11a, a lower side portion 11b arranged with a predetermined spacing from the upper side portion 11a, and a connecting portion 11c that electrically connects the upper side portion 11a and the lower side portion 11b.

The lower side portion 11b is arranged farther from an area through which the user passes than the upper side portion 11a.

The installation height of the upper side portion 11a is greater than or equal to the installation height of the lower side portion 11b.

Therefore, a human body (foot kick movement) can be reliably detected with only one sensor electrode, whereby a capacitive proximity sensor can be obtained that allows for cost reduction.

Furthermore, the installation height of the upper side portion 11a may be higher than the installation height of the lower side portion 11b.

Therefore, a human body (foot kick movement) can be reliably detected with at least one sensor electrode, whereby a capacitive proximity sensor can be obtained, which allows for cost reductions.

Furthermore, the installation angle θ between the lower side portion 11b and the upper side portion 11a is within the range of 20 degrees to 70 degrees, with respect to the direction of movement of the automobile.

The sensor electrode can thereby be installed without unduly taking up installation space in the automobile.

Furthermore, the installation angle θ between the lower side portion 11b and the upper side portion 11a is within the range of 30 degrees to 60 degrees, with respect to the direction of movement of the automobile.

The sensor electrode can thereby be installed without unduly taking up installation space in the automobile.

Furthermore, the connecting portion 11c is located at the ends of the lower side portion 11b and the upper side portion 11a, and the sensor electrode 11 constitutes a C shape.

An exemplary mode of embodiment of the present invention was described above, but the present invention is not limited to the aforementioned exemplary mode of embodiment, and it is a matter of course that the exemplary mode of embodiment described above can be suitably modified, within a range that does not depart from the gist of the present invention.

The connecting portion 11c in the exemplary mode of embodiment described above is located at the ends of the lower side portion 11b and the upper side portion 11a, such that, when viewed from the rear of the automobile 100, the sensor electrode is substantially C-shaped, but there is no limitation to this.

Figure 10A:
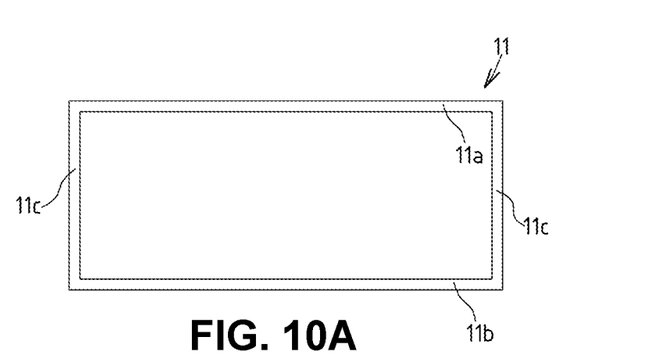
FIGS. 10A, 10B, and 10C show variants of the sensor electrode in the capacitive proximity sensor according to the exemplary mode of embodiment of the present invention.

For example, as shown in FIG. 10A, connecting portions 11c may be located at both ends of the lower side portion 11b and the upper side portion 11a, such that when viewed from the rear of the automobile 100, the sensor electrode is substantially O-shaped (variant 1).

Figure 10B:
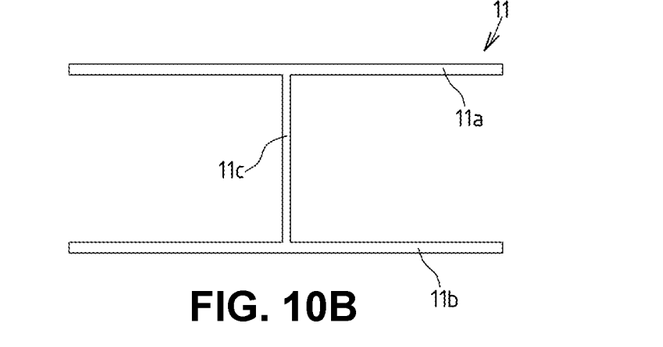

Furthermore, for example, as shown in FIG. 10B, the connecting portion 11c may be located midway on the lower side portion 11b and the upper side portion 11a, such that, when viewed from the rear of the automobile 100, the sensor electrode is substantially H-shaped (variant 2).

In the exemplary mode of embodiment described above, the total length of the upper side portion 11a in the vehicle width direction was the same as the total length of the lower side portion 11b in the vehicle width direction, and the lower side portion 11b was arranged so as to face the upper side portion 11a, along the entirety thereof, but there is no limitation to this.

Figure 10C:
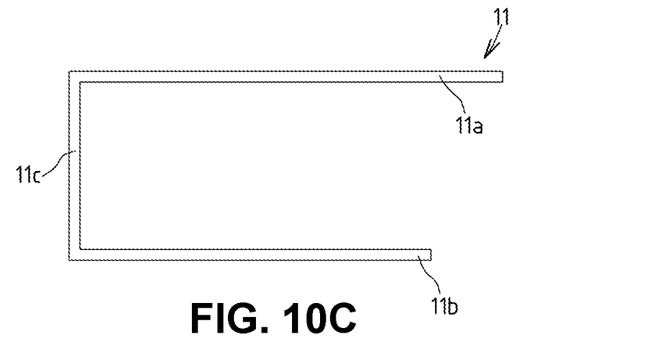

For example, as shown in FIG. 10C, the total length of the upper side portion 11a in the vehicle width direction may exceed the total length of the lower side portion 11b in the vehicle width direction, and the lower side portion 11b may be arranged so that the entirety thereof faces the upper side portion 11a. (variant 3).

If the total length of the lower side portion 11b in the vehicle width direction were to exceed the total length of the upper side portion 11a in the vehicle width direction, and if the upper side portion 11a were arranged so that the entirety thereof faces the lower side portion 11b, while a kick movement by the user can be detected by way of the lower side portion, if the user stands slightly distanced (approximately 1 cm) from the rear bumper 101, there will be cases in which the fact that the user is standing slightly distanced (approximately 1 cm) from the rear bumper 101 will not be detected by the upper side portion. Therefore, it would be possible that, when a kick movement by the user is detected by way of the lower side portion, the back door 102 for which the opening and closing control is performed would strike the user.

Here, it is preferable that the total length of the upper side portion 11a in the vehicle width direction exceeds the total length of the lower side portion 11b in the vehicle width direction, and the lower side portion 11b is arranged so as to face the upper side portion 11a, along the entirety thereof.

Thereby, if the user stands in a place where the kick movement can be detected by way of the lower side portion 11b, the upper side portion can reliably detect that the user is standing slightly distanced (approximately 1 cm) from the rear bumper 101, so that there is no risk of the back door 102, for which opening and closing control is performed, striking the user.

In the exemplary mode of embodiment described above, the configuration is such that there is one each of the upper side portion 11a, the lower side portion 11b, and the connecting portion 11c, but there is no limitation to this.

Figure 11A:
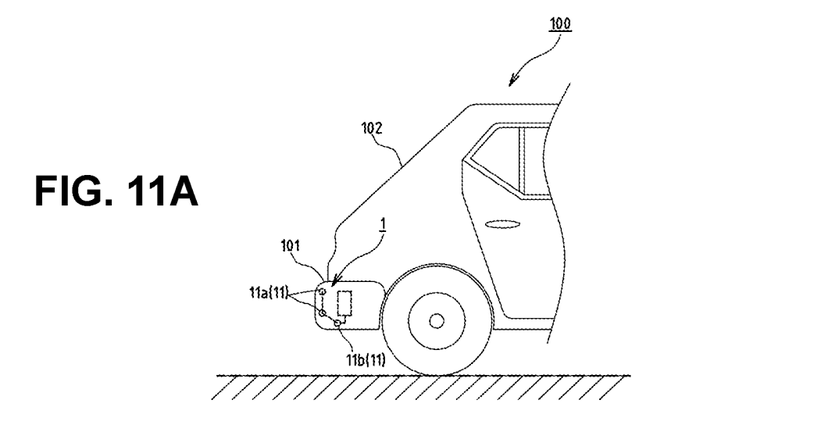
FIG. 11A is a schematic view showing the situation in which a sensor electrode constituting variant 4 according to an exemplary mode of embodiment of the present invention is installed on an automobile.
Figure 11B:
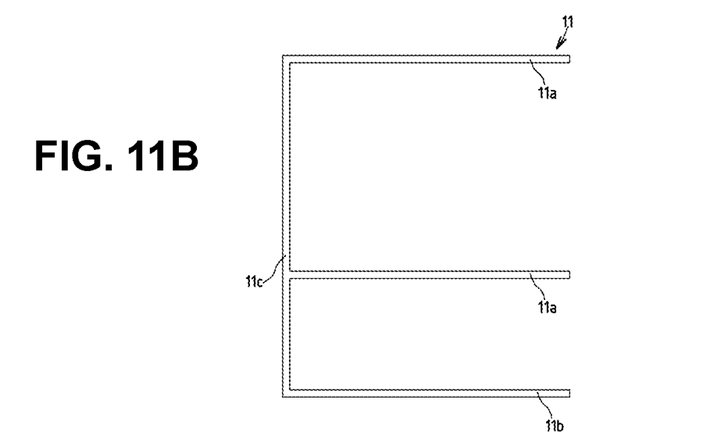
FIG. 11B is an enlarged view of a sensor electrode viewed from the rear of an automobile 100.
Figure 11C:
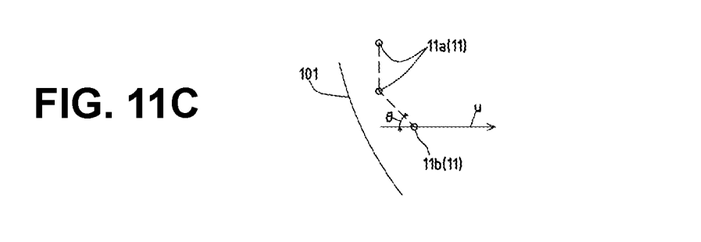
FIG. 11C is a schematic view which shows the installation angle θ of the upper side portion 11a and the lower side portion 11b of the sensor electrode.

For example, as shown in FIGS. 11A, 11B, and 11C the configuration may be such that there are two upper side portions 11a, and one each of the lower side portion 11b and the connecting portion 11c (variant 4).

Specifically, the sensor electrode in variant 4 has another upper side portion 11a arranged, with a predetermined spacing, substantially parallel to and above, in the vehicle height direction, the upper side portion 11a in the exemplary mode of embodiment described above, and a connecting portion 11c extending upward in the vehicle height direction for this other upper side portion 11a. With the sensor electrode of variant 4, the fact that the user is standing slightly distanced (approximately 1 cm) from the rear bumper 101 can be more reliably detected by virtue of the two upper side portions 11a.

Although the lower side portion 11b and the upper side portion 11a have the same diameter in the exemplary mode of embodiment described above, there is no limitation to this.

For example, the outer diameter of the upper side portion 11a may be larger than the outer diameter of the lower side portion 11b. Consequently, the detection sensitivity of the upper side portion will be higher than that of the lower side portion.

In the exemplary mode of embodiment described above, a case in which the capacitive proximity sensor is mounted in the rear bumper of the vehicle was described, but the capacitive proximity sensor of the present invention can also be applied to a sliding door of a vehicle and the like.

In the exemplary mode of embodiment described above, the total length of the sensor electrode 11 in the vehicle width direction is slightly less than the total length of the automobile in the vehicle width direction, and one substantially C-shaped sensor electrode 11 is arranged inside the rear bumper 101, but there is no limitation to this.

For example, the total length of the sensor electrode in the vehicle width direction may be slightly shorter than half of the total length of the automobile in the vehicle width direction, and two of these sensor electrodes may be arranged in a row along the vehicle width direction inside the rear bumper 101.

Furthermore, for example, the total length of the sensor electrode in the vehicle width direction may be slightly shorter than one third of the total length of the automobile in the vehicle width direction, and three of these sensor electrodes may be arranged in a row along the vehicle width direction inside the rear bumper 101.

What is claimed is:

1. A capacitive proximity sensor, comprising:
   a resonance circuit having a sensor electrode; and a microcomputer that inputs a signal for detecting a user to the resonance circuit, wherein:
   the sensor electrode has an upper side portion, a lower side portion arranged with a predetermined spacing from the upper side portion, and a connecting portion that electrically
   connects the upper side portion and the lower side portion;
   the lower side portion is arranged farther from an area through which the user passes than the upper side portion; and
   the installation height of the upper side portion is greater than or equal to the installation height of the lower side portion; and
   wherein the sensor electrode is formed as a single continuous electrode including the upper side portion, the lower side portion, and the connecting portion;
   wherein the connecting portion is located at only one end of the lower side portion and the upper side portion, and the sensor electrode constitutes a C shape;
   wherein the upper side portion is a straight and the lower side portion is straight, and
   wherein the straight lower side portion is arranged parallel to the straight upper side portion at a predetermined spacing; and
   wherein the straight upper side portion in a vehicle width direction extends longer that the straight lower side portion in the vehicle width direction,
   wherein the straight upper side portion in a vehicle width direction of a vehicle extends longer that the straight lower side portion in the vehicle width direction.

2. The capacitive proximity sensor according to claim 1, wherein:
   the installation height of the upper side portion is higher than the installation height of the lower side portion.

* * * * *